United States Patent [19]
Carobolante

[11] Patent Number: 5,124,586
[45] Date of Patent: Jun. 23, 1992

[54] IMPEDANCE MULTIPLIER

[75] Inventor: Francesco Carobolante, Phoenix, Ariz.

[73] Assignee: SGS-Thomson Microelectronics, Inc., Carrollton, Tex.

[21] Appl. No.: 745,916

[22] Filed: Aug. 16, 1991

[51] Int. Cl.⁵ .......................... H03K 3/01; G06G 7/12
[52] U.S. Cl. .................................. 307/490; 307/296.6; 307/493
[58] Field of Search ................. 307/264, 296.1, 296.3, 307/296.4, 296.6, 490, 493

[56] References Cited

U.S. PATENT DOCUMENTS

| 3,300,658 | 1/1967 | Slusher et al. | 307/303 |
| 3,555,309 | 1/1971 | Limberg | 307/296.6 |
| 3,577,167 | 5/1971 | Avins | 307/296.6 |
| 3,778,734 | 12/1973 | Colardelle et al. | 307/296.6 |
| 3,942,046 | 3/1976 | Limberg | 307/296.8 |
| 3,946,279 | 3/1976 | Paice et al. | 333/213 |
| 4,061,959 | 12/1977 | Ahmed | 307/296.6 |
| 4,097,768 | 6/1978 | Jenik | 307/490 |
| 4,160,201 | 7/1979 | Ahmed | 330/297 |
| 4,517,508 | 5/1985 | Sakai | 307/264 |
| 4,734,593 | 3/1988 | Teymouri et al. | 307/296.6 |

Primary Examiner—Stanley D. Miller
Assistant Examiner—Terry D. Cunningham
Attorney, Agent, or Firm—Richard A. Bachand; Lisa K. Jorgenson; Richard K. Robinson

[57] ABSTRACT

A circuit for presenting a multiplied impedance at in input node includes a resistor having a value desired to be multiplied at the input node connected at one end to a reference potential. A first transistor has a current path in series between the input node and the other end of the resistor. A voltage divider is connected at one end to the reference potential, and a second transistor has a current path in series between a voltage source and the other end of the voltage divider, so that the second transistor and the voltage divider form an emitter follower circuit, to provide feedback to said first transistor circuit. A current control element of the first transistor is connected to receive the divided voltage from the voltage divider, and a current control element of the second transistor being connected to the input node. The transistors can be either bipolar, enhancement FET or MOS enhancement FET type devices.

8 Claims, 1 Drawing Sheet

IMPEDANCE MULTIPLIER

BACKGROUND OF THE INVENTION

1. Field of the Invention

This invention relates to improvements in electronic circuits, and more particularly to improvements in electronic circuitry for providing a high equivalent impedance without using a high value resistor, and more particularly to such circuits for use in integrated circuit applications to enable reduced area requirements for circuit construction.

2. Description of the Prior Art

One of the foremost considerations in the fabrication of integrated circuits is the conservation of space on the semiconductor wafer in which the circuit is to be fabricated. Accordingly, it is generally a design goal to make the sizes of the components as small as possible to conserve space. However, it is difficult to fabricate high value resistors in semiconductors that can also carry relatively high currents without making the area of the resistor relatively large.

Frequently in such integrated circuit designs, although it would be desirable to use high resistors, for example, in circuits requiring high load impedances, the space which would be required proscribe the range of impedances which can be employed, and may adversely impact the design of the circuit with which it may be associated.

SUMMARY OF THE INVENTION

In light of the above, it is, therefore, an object of the invention to provide a circuit which provides a high dynamic impedance suitable for integrated circuit load applications and the like, which does not require that high impedance elements be provided.

It is another object of the invention to provide an input impedance which is multiplied from the impedance of smaller impedances contained in the circuit.

It is still another object of the invention to prove a circuit of the type described in which the circuit has a relatively high input impedance, and relatively small internal resistors.

It is another object of the invention to provide a circuit of the type described which can be realized with either bipolar or MOS transistors.

It is another object of the invention to provide a circuit which provides a large dynamic load impedance for use in an integrated circuit, without requiring a proportionately large area of the semiconductor in which the circuit is fabricated.

These and other objects, features and advantages of the invention will be apparent to those skilled in the art from the following detailed description of the invention, when read in conjunction with the accompanying drawings and appended claims.

In accordance with a broad aspect of the invention, a circuit for presenting a multiplied impedance at in input node includes a resistor having a value desired to be multiplied at the input node connected at one end to a reference potential. A first transistor has a current path in series between the input node and the other end of the resistor. A voltage divider is connected at one end to the reference potential, and a second transistor has a current path in series between a voltage source and the other end of the voltage divider, so that the second transistor and the voltage divider form an emitter follower circuit, to provide feedback to said first transistor circuit. A current control element of the first transistor is connected to receive the divided voltage from the voltage divider, and a current control element of the second transistor being connected to the input node. The transistors can be either bipolar, enhancement FET or MOS enhancement FET type devices.

In accordance with another aspect of the invention, a similar circuit is used in conjunction with the above described circuit for presenting a multiplied impedance that is of construction. The two circuits are connected with reference to a voltage level which is about midway between the supply voltage and the reference voltage. In a bipolar embodiment, one of the circuits is formed of NPN transistors, and the other circuit is formed of PNP transistors.

BRIEF DESCRIPTION OF THE DRAWINGS

The invention is illustrated in the accompanying drawings, in which.

DETAILED DESCRIPTION OF THE PREFERRED EMBODIMENT

Figure 1:
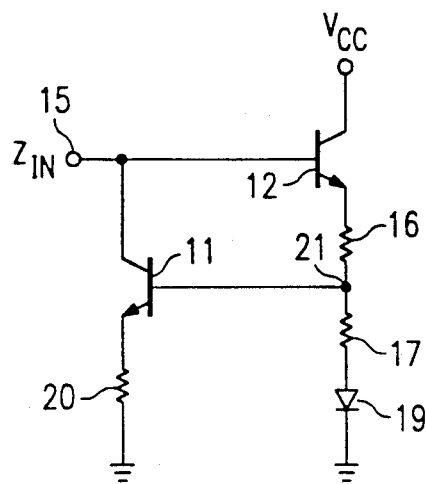
FIG. 1 is an electrical schematic diagram of a circuit providing a high impedance, in accordance with a preferred embodiment of the invention.

A preferred embodiment of a circuit 10 for providing a high equivalent dynamic impedance is illustrated in FIG. 1 and uses two NPN transistors 11 and 12. The first NPN transistor 12 has its base connected to the input node 15 of the circuit 10, and its collector connected to a voltage supply, $V_{cc}$. As will become apparent, for proper operation, $V_{cc}$ is greater than the voltage on the input node 15, $V_{IN}$. The emitter of the NPN transistor 12 is connected to a reference potential, or ground, through a series path, including resistors 16 and 17 and a diode 19. The diode 19 is optionally included in the circuit in those applications in which linearity is desired to be particularly well controlled, and may conveniently be formed of a transistor of similar construction to the NPN transistor 11, but having its collector and base connected. Thus, the voltage drop across the diode 19 will compensate for the $V_{be}$ drop across the NPN transistor 11.

The second NPN transistor 11 also has its collector connected to the input node 15 of the circuit 10, and its emitter connected to a reference potential, or ground, through a resistor 20. The base of the NPN transistor 11 is connected to the junction 21 of the resistors 16 and 17 in the emitter path of the NPN transistor 12.

It can be seen that the NPN transistor 12 in combination with the resistors 16 and 17 acts like an emitter follower amplifier, with a portion of the voltage upon the resistors 16 and 17 providing the biasing voltage for the base of the transistor 11. The value of the biasing voltage can be adjusted, depending upon the ratio of the resistors 16 and 17. By virtue of the voltage divider action of resistors 16 and 17, which establishes the bias on the base of the NPN transistor 11, the resistance of the resistor 20 is essentially multiplied by the ratio of resistances of resistors 16 and 17. The input impedance of the circuit 10 is, therefore $Z_{IN} = R_{20} \times (R_{17}+R_{16})/R_{17}$.

More particularly, as the current which is delivered to the base of the NPN transistor 12 increases or decreases, the NPN transistor 11 is turned harder towards on or off, thereby increasing the current through the resistor $R_{20}$, increasing the voltage dropped across it. If the NPN transistors 11 and 12 are made with a very high beta, their base currents will not be significant. Thus, when the transistors are biased in their conducting states, if $V_{IN}$ is large compared to $V_{be}$ the voltage on the junction 21 will be the voltage in the input node 15 reduced by the ratio of the voltage divider resistors $R_{16}$ and $R_{17}$. This voltage will be presented across the emitter resistor $R_{20}$ of the NPN transistor 11. The current through the resistor $R_{20}$, will therefore be $1/K \times V_{IN}/R_{20}$, where K is an effective resistance multiplier created through the operation of the NPN transistor That is, the current gain of the transistor 11 produces a current in its collector-emitter path which is K times smaller than it would be if only resistor $R_{20}$ were present, making the apparent impedance of the circuit K times higher.

It will be appreciated that the circuit embodiment of FIG. 1 may exhibit a certain degree of nonlinearity, at least until the turn on voltage of the NPN transistors ($2V_{be}$) has been exceeded. Below that threshold value, the impedance seen at the input $Z_{IN}$ will be extremely high. Also, the circuit embodiment of FIG. 1 would be useful primarily in applications in which a high impedance is required with regard primarily to voltages on the input node 15 between the supply voltage $V_{cc}$ and the reference potential, or ground.

Figure 2:
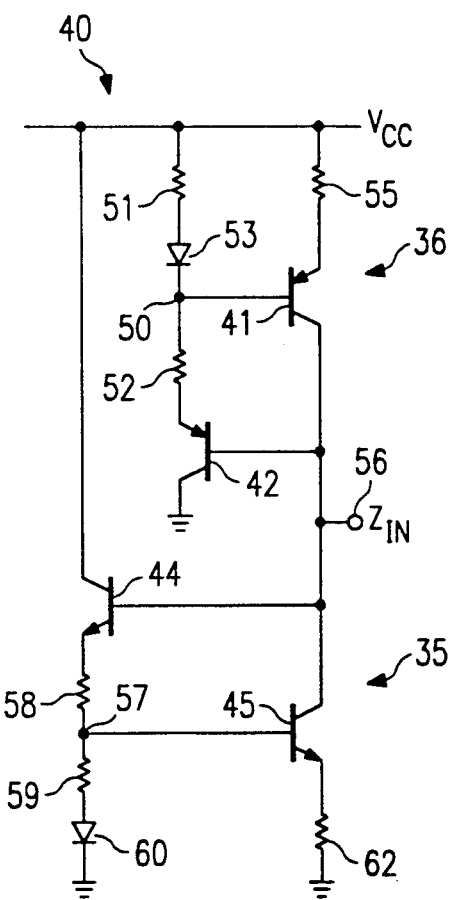
FIG. 2 is an electrical schematic diagram of a balanced implementation of a circuit for providing a high equivalent impedance, in accordance with another preferred embodiment of the invention.

Accordingly, a balanced embodiment of the impedance multiplying circuit, in accordance with another preferred embodiment of the invention, which will be effective to provide high impedances for a range of both positive and negative input voltages from a midpoint voltage between $V_{cc}$ and the reference potential, is shown in FIG. 2. In FIG. 2, the circuit 40 uses four transistors 41, 42, 44, and 45. As shown, a first impedance multiplying circuit 35 is formed from the NPN transistors 44 and 45, which are connected between the input node 56 and ground in a manner similar to the circuit 10 described above with reference to FIG. 1, and, in addition, a second impedance multiplying circuit 36 is formed of the PNP transistors 41 and 42, connected between the input node 56 and $V_{cc}$ in a similar manner.

More particularly, the PNP transistor 41 has its base connected to the junction 50 of the voltage dividing resistors 51 and 52, which are connected in series between the supply voltage, $V_{cc}$ and the emitter of the PNP transistor 42. A diode 53 also may be provided, as shown, for linearity. The PNP transistor 41 also has its emitter connected by a resistor 55 to the supply voltage, $V_{cc}$, and its collector connected to the input node 56. The other PNP transistor 42 has its base connected to the input node 56, and its collector connected to a reference potential, or ground.

The NPN transistor 44 of the other impedance multiplying circuit 35 of the circuit 40 has its base also connected to the input node 56, its collector connected to the supply voltage, $V_{cc}$, and its emitter connected to be voltage divider resistors 58 and 59 connected in series to a reference potential, or ground. As shown, a diode 60 may be included for linearity. The NPN transistor 45 has its base connected to the junction 57 between the resistors 58 and 59, its collector connected to the input node 56, and its emitter connected by a resistor 62 to a reference potential or ground.

As mentioned, the NPN transistor circuit 35 is effective to multiply input impedances for input voltages in a direction toward the reference potential, and the PNP transistor circuit 36 is effective to multiply input impedances for input voltages in the direction of the source potential, $V_{cc}$. By selecting the values of the various resistors, the effective voltage ranges of the respective circuits can be selected. For example, the values of the corresponding resistors of the two circuits which form the overall impedance multiplying circuit 40 can be made equal; for example, $R_{62}=R_{55}$, $R_{51}=R_{59}$, and $R_{52}=R_{58}$, for balanced operation.

With the circuit thus configured, it can be seen that the impedance seen at the input node 56 of the circuit of FIG. 2 is: $Z_{IN} = R_{62} \times (R_{58}+R_{59})/2R_{59}$.

Figure 3:
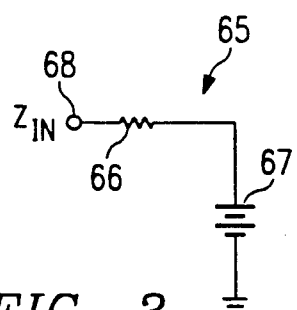
FIG. 3 is an electrical schematic diagram of an equivalent circuit of the circuit of FIGS. 1 and 2.

Thus, the equivalent electrical circuit 65 shown in FIG. 3, represents both the circuit 10 of FIG. 1 and the circuit 40 of FIG. 2. The equivalent circuit 65 includes a resistor 66 connected in series with a source of potential, such as a battery 67, the series being connected between the input node 68 and a reference potential, or ground. The resistance of the resistor 25 for each of the circuits of FIGS. 1 and 2 is $Z_{IN}$, and the voltage of the battery 26 has a value of approximately $2V_{be}$ for the circuit of FIG. 1 and $V_{cc}/2$ for the circuit of FIG. 2. Thus, the circuit 10 can provide an excellent high value impedance load, for use, for example, for a preceding circuit on the same integrated circuit chip (not shown).

The impedance multiplying circuit, in accordance with the invention, may be constructed with enhancement type FET transistors, and more particularly, MOS enhancement FET transistors, as well as with bipolar transistors, as illustrated. Since one of the preferred design considerations is to minimize the base current of the bipolar transistors, as explained above, MOS circuit embodiments are particularly well adapted for use in realizing the circuit of the invention, since the gate current in such devices inherently will be minimal.

Although the invention has been described and illustrated with a certain degree of particularity, it is understood that the present disclosure has been made by way of example only, and that numerous changes in the combination and arrangements of parts and features can be made by those skilled in the art without departing from the spirit and scope of the invention, as hereinafter claimed.

I claim:

1. A circuit for presenting an equivalent resistance, at an input node, representing a multiplied resistance comprising:
   a first resistor, $R_1$, having a value desired to be multiplied at said input node for voltages on said input node in a range below a voltage source, said first resistor being connected at one end to a reference voltage;
   a first transistor of first conductivity type connected in series between said input node and another end of said first resistor;
   a first voltage divider connected at one end to said reference voltage;
   a second transistor of said first conductivity type connected in series between said voltage source and another end of said first voltage divider;

a control terminal of said first transistor being connected to receive a divided voltage from said first voltage divider;

a control terminal of said second transistor being connected to said input node;

a second resistor, $R_2$, having a value desired to be multiplied at said input node for voltages on said input node in a range above said reference voltage source, said second resistor being connected at one end to said voltage source;

a third transistor of second conductivity type connected in series between said input node and another end of said second resistor;

a second voltage divider connected at one end to said voltage source;

a fourth transistor of said second conductivity type connected in series between said reference voltage and another end of said second voltage divider;

a control terminal of said third transistor being connected to receive a divided voltage from said second voltage divider; and a current control terminal of said fourth transistor being connected to said input node.

2. The circuit of claim 1 wherein said transistors are bipolar transistors.

3. The circuit of claim 2 wherein said first and second transistors are NPN transistors, and said third and fourth transistors are PNP transistors.

4. The circuit of claim 1 wherein said first voltage divider comprises third and fourth resistors $R_3$ and $R_4$, and said second voltage divider is fifth and sixth resistors $R_5$ and $R_6$.

5. The circuit of claim 4 wherein the first and second resistors are equal, the third and fifth resistors are equal, and the fourth and sixth resistors are equal, whereby the impedance at said input node is:

$$Z_{IN} = R_1 \times (R_3 + R_4)/2R_3.$$

6. A circuit for providing a load impedance at an input node representing a multiplied impedance comprising:

a first impedance having a value desired to be multiplied to provide said load impedance, said first impedance being connected at one end to a reference voltage;

a first transistor connected between said input node and another end of said first impedance;

a first voltage divider connected at one end to said reference voltage;

a second transistor connected between a voltage source and another end of said first voltage divider;

a control terminal of said first transistor being connected to receive a divided voltage from said first voltage divider;

a control terminal of said second transistor being connected to said input node;

a second impedance having a value desired to be multiplied to provide said load impedance, said second impedance being connected at one end to said voltage source;

a third transistor connected between said input node and another end of said second impedance;

a second voltage divider connected at one end to said voltage source;

a fourth transistor connected between said reference voltage and another end of said second voltage divider;

a control terminal of said third transistor being connected to receive a divided voltage from said second voltage divider; and a control terminal of said fourth transistor being connected to said input node.

7. The circuit of claim 6 wherein said first, second, third and fourth transistors are bipolar transistors.

8. The circuit of claim 7 wherein said first and second transistors are PNP transistors, and said third and fourth transistors are NPN transistors.

* * * * *